(12) United States Patent
Blon

(10) Patent No.: US 6,498,574 B2
(45) Date of Patent: Dec. 24, 2002

(54) DIGITAL-TO-ANALOG CONVERTER WITH CONSTANT BIAS VOLTAGE

(75) Inventor: Thomas Blon, Santa Cruz, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/865,381

(22) Filed: May 25, 2001

(65) Prior Publication Data

US 2002/0175848 A1 Nov. 28, 2002

(51) Int. Cl.$^7$ ................................................. H03M 1/66
(52) U.S. Cl. ...................... 341/144; 341/136; 341/153
(58) Field of Search ................................ 341/136, 133, 341/144, 153

(56) References Cited

U.S. PATENT DOCUMENTS

| | | | | |
|---|---|---|---|---|
| 4,384,274 A | * | 5/1983 | Mao ..................... | 340/347 DA |
| 5,406,285 A | * | 4/1995 | Diffenderfer et al. ....... | 341/144 |
| 5,661,483 A | | 8/1997 | Negahban et al. | |
| 5,726,652 A | | 3/1998 | Giuroiu | |
| 5,727,024 A | | 3/1998 | Hauptmann | |
| 5,798,723 A | * | 8/1998 | Fong ......................... | 341/136 |
| 5,952,880 A | | 9/1999 | Voorman et al. | |
| 6,067,036 A | | 5/2000 | Mauthe et al. | |

OTHER PUBLICATIONS

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages, last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accesssed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

*Primary Examiner*—Howard L. Williams
(74) *Attorney, Agent, or Firm*—Brinks Hofer Gilson & Lione

(57) ABSTRACT

Digital-to-analog converters (DACs) are used to convert digital signals to analog signals. DAC's are typically made of transistors, linked in one of several ways, to quickly convert large amounts of digital information to useful analog signals. Sample applications may include compact disc players and DVD players. DACs with transistors having more uniform outputs result from better control of the source-to-gate voltage. This control may be achieved by using a current source for the gate voltages, or in other embodiments, by designing and manufacturing the bus bar for the source voltage and the gate voltage so as to achieve uniform source-to-source and gate-to-source voltages. With this control, uniform voltage drops, linear within 0.1%, may be achieved in transistors used in 5-bit to 15-bit DACs, leading to better conversion.

13 Claims, 8 Drawing Sheets

DIGITAL-TO-ANALOG CONVERTER WITH CONSTANT BIAS VOLTAGE

BACKGROUND OF THE INVENTION

There are a number of recognized ways to convert digital data to an analog signal. Included are the well-known R-2R networks using a binary scale of voltages and currents. Binary weighted currents flowing in a given position may be routed to ground or to the summing input of an operational amplifier. The positions of switches reproduce the code of the digital information to be converted. A series of MOS transistors may be used as the switches, but as currents increase, the design becomes complicated in order to keep voltage drops constant. In addition, a series of resistors may be needed to keep the emitters (or sources) of the series of transistors at the same potential. The accuracy of R-2R circuits is based on the tracking of the resistances. It may be difficult to achieve 10 or 12 bit conversion.

Switched capacitors are also used to perform digital-to-analog conversion. Capacitors may be integrated and have less dependence on temperature than resistive circuits, especially thin-film resistors. Capacitors suffer other drawbacks, however, and require special care in order to provide reasonable speed and good tracking. Integrated capacitors are sandwiches of metal-oxide-silicon (MOS technology) or polysilicon-oxide-polysilicon (double poly technology). These latter exhibit a highly linear behavior and extremely small temperature coefficients of performance, typically 10 to 20 ppm per degree Celsius. In order to improve geometrical tracking, capacitors must represent a combination of "unit" capacitance, where a unit capacitance represents the minimum-sized element available, typically 100 fF. MOS capacitors have relatively large stray capacitances to the substrate through their inversion layer, typically 10 to 30% of their nominal capacitance value, depending on the oxide thickness. Double poly capacitors offer better performance, but the manufacturing process is far more complicated and expensive, with greater chances for errors. Digital-to-analog converters using capacitor integration must also be designed to tolerate stray capacitance.

Another widely used technique to transform digital data to an analog signal is to parallel many identical transistors, controlled by a single base-to-emitter or gate-to-source voltage source. The output terminals are tied together to implement banks of binary weighted current sources. This requires $2^N$ transistors to make an N-bit converter. For example, an 8-bit converter requires a series of $2^8$, or 256 transistors. However, in MOS technology, transistors are the smallest on-chip devices available, and the technique is an accepted one. In addition, MOS manufacturing techniques tend to be robust, and it is far easier to attain 10-bit accuracy, for example, than with capacitance MOS or double poly techniques. Also this technique is preferred for high speed digital to analog conversion since it uses an open loop structure i.e no feedback is used which might limit the operation speed significantly.

Some of the disadvantages of these techniques may include the need for trimming of resistors to insure that each transistor is kept at the same potential. Trimming requires more processing and even laser trimming in some cases. Better performance is achieved by keeping the gate-to-source potential for each transistor the same, that is, keeping the gate-to-source potential constant. What is needed is a better way to keep the gate-to-source potential of each transistor the same and thus to better perform digital to analog conversion.

BRIEF SUMMARY

The present invention meets this need by providing a current source for the gates in a series of transistors in a digital-to-analog converter. In one embodiment, a current source is provided for a digital-to-analog converter cell row. The circuit includes a power source, a series of MOS transistors, and a path to ground. The source of a first power transistor in the series is connected to its own gate and to the gate of the next transistor. Thereafter, the gate of each transistor is connected to the gate of the next transistor in the series. All sources of the transistors are connected are connected to the power source. The gate-to-source voltage of each transistor in the circuit is the same, constant, because the resistor in each circuit has the same value, and the current flowing in the circuit is the same. Thus, the constant drop from transistor to transistor is the same, and each transistor has a constant gate-to-source value.

In another embodiment, the resistors are eliminated, and the gate of each transistor is connected directly to a constant potential. The sources in a series of transistors are connected to a busbar at a potential, and the busbar is tapered. The busbar supplies both voltage and current, frequently 10–20 mA or more, and is tapered from wide at a near end near the source voltage source, to narrow at an end away from the source voltage. Therefore, the current flow in the first transistors at the near end does not affect the voltage available to the transistors at the far end. Without this taper, the current draw from the first transistors may cause an IR drop through the busbar, resulting in a lower potential at the far end, and thus a lower source voltage available to the transistors.

In another embodiment, the busbar for the sources is not tapered, but the busbar for the gates has an inverse taper, that is, it is narrowest at an end near the gate voltage source and has an increasing taper at a far end, away from the gate voltage source. In this manner, the potential at each source is slightly less than the previous source; and the potential at each gate is slightly less than the previous gate. Thus, the source-to-gate voltage is constant. When the digital-to-analog (DAC) switches are activated, the source-to-gate voltages are also constant; that is, they are the same from transistor to transistor in the DAC.

DETAILED DESCRIPTION OF THE INVENTION

Digital-to-analog converters for high-speed data applications, such as those involving compact discs and DVD discs, have high-speed and high-accuracy. These circuits are charging and recharging, converting and recovering at ever-faster speeds, typically requiring open-loop circuitry in which feedback regulation of voltages and currents is not possible. Therefore, improved linearity in circuits, and in particular in transistors, is the goal.

Figure 1:
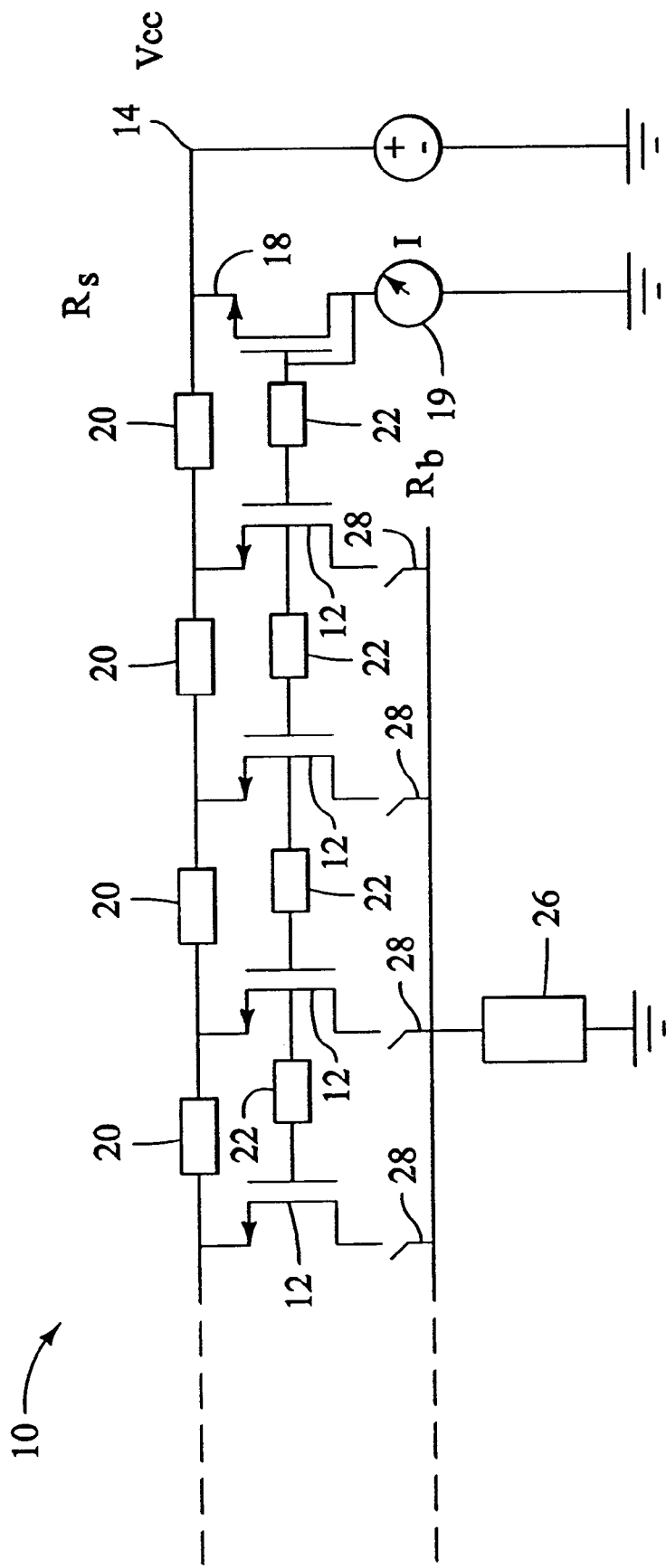
FIG. 1 depicts a prior art MOS digital-to-analog converter.

FIG. 1 depicts a prior-art digital-to-analog converter 10 with a series of transistors 12. One supply voltage 14 feeds the transistor rail 16 and a gate supply transistor 18 and current supply 19. The transistor sources are connected by a series of small resistors $R_S$ 20, thus providing a small, controlled voltage drop from one transistor to the next. The gate supply for the series is provided from the supply transistor through a series of gate resistors $R_b$ 22. No current flows in the gate circuit, because the gate series are relatively high resistance and the only current path is through the supply transistor 18 to ground. Therefore, the voltage at each gate is constant.

In this design, each transistor in the digital-to-analog converter (DAC) is a unit current supply having a gate control voltage determined by the difference between the source voltage and the gate voltage for that transistor. The output of the DAC is summed when one or more of the switches 28 are closed, depending on the digital data, and the voltage across $R_{load}$ 26 is measured. The gate voltage is constant, but the source voltage becomes progressively less and less through the series of transistors because of the small drop for each transistor. Thus, the gate-to-source voltages are different for each transistor.

Figure 2:
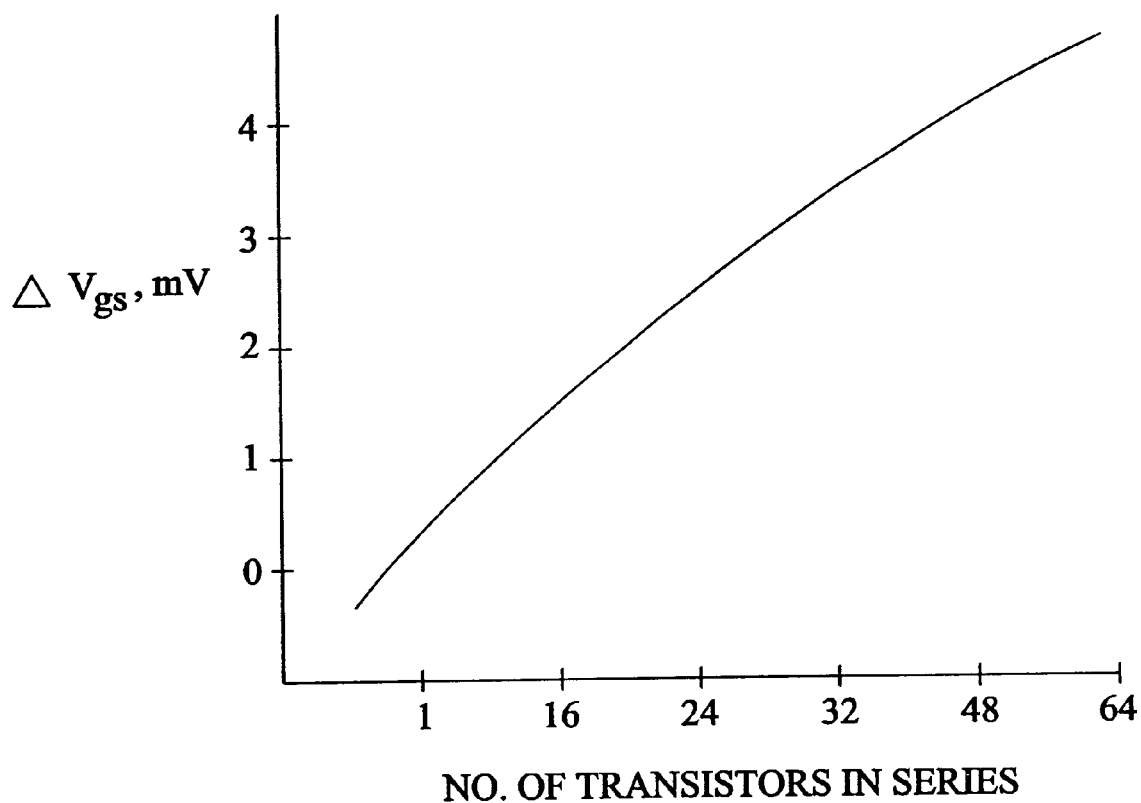
FIG. 2 depicts prior art MOS performance.

The voltage drop across each resistor $R_S$ is equal to the ohmic value of the resistor multiplied by the current that remains in the transistor rail 16. If the current flowing from $V_{CC}$ is $I_0$, and the drain-to-source current of the nth transistor is $I_N$, then the voltage drop in the Nth $R_S$ resistor is $R_S \cdot I_N$, where $I_N$ is $I_0$ less all the currents from $I_1$ to $I_{N-1}$. If all the resistances are constant and are equal to $R_S$, and each drain-to-source current is identical to $I_N$, then the cumulative voltage drop from the power supply 14 to the Nth resistor will equal $\Delta V_{SN} = N \cdot R_S \cdot (I_0 - 1/2 \cdot (N+1) \cdot I_N)$, and the voltage drop across N transistors will increase monotonically. The cumulative effect is shown in FIG. 2 for a digital-to-analog converter row of 64 current sources. The cumulative difference for the 64$^{th}$ source is about 4 mv in this example. That is, the $V_{GS}$ of the last transistor is about 4 mv less than the $V_{GS}$ of the first transistor. If $V_{SAT}$ is 500 mv, and the ratio of current delivered varies as a function of the square of $V_{GS}$, then there may be a 1.6% difference in the current from the first to the last transistor.

Figure 3:
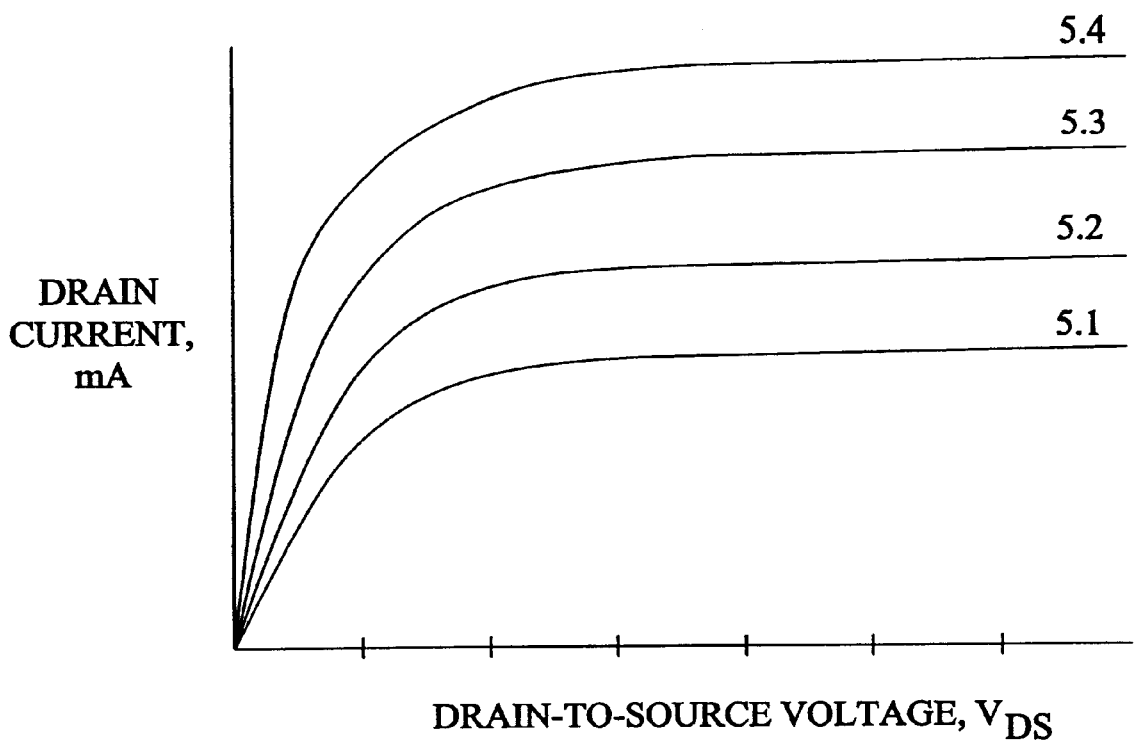
FIG. 3 depicts the effect of drain-to-source voltage on transistor current.
Figure 4:
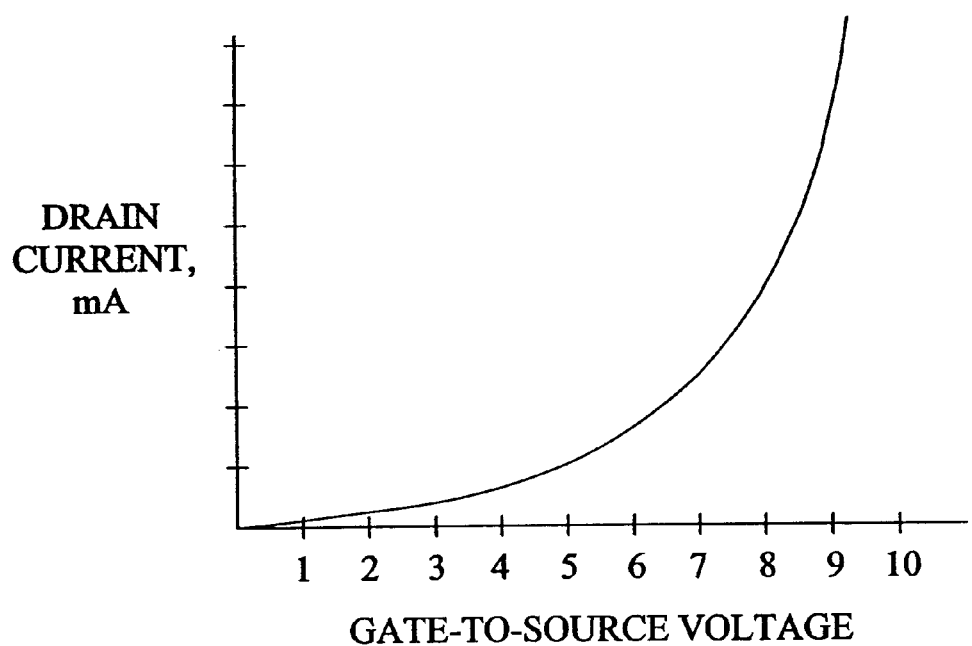
FIG. 4 depicts the effect of gate-to-source voltage on transistor current.

FIGS. 3 and 4 depict the consequence of these variations on typical transistors. In FIG. 3, drain-to-source voltage is depicted on the left-to-right axis or x-axis, while drain current is depicted on the y-axis. Each curve in the figure shows the significant effect of drain-to-source voltage, $V_{CC}$ on the drain current. The graph also depicts the effect of the gate-to-source voltage, $V_{GS}$, each curve resulting from a different $V_{GS}$. FIG. 4 depicts the effect on drain current of $V_{GS}$ alone, with $V_{CC}$ held constant. Great variations in drain current result from variations in either gate or drain voltages. A digital-to-analog converter ideally sums currents from a series of transistors, so the performance of the converter depends on accurate voltages.

Figure 5:
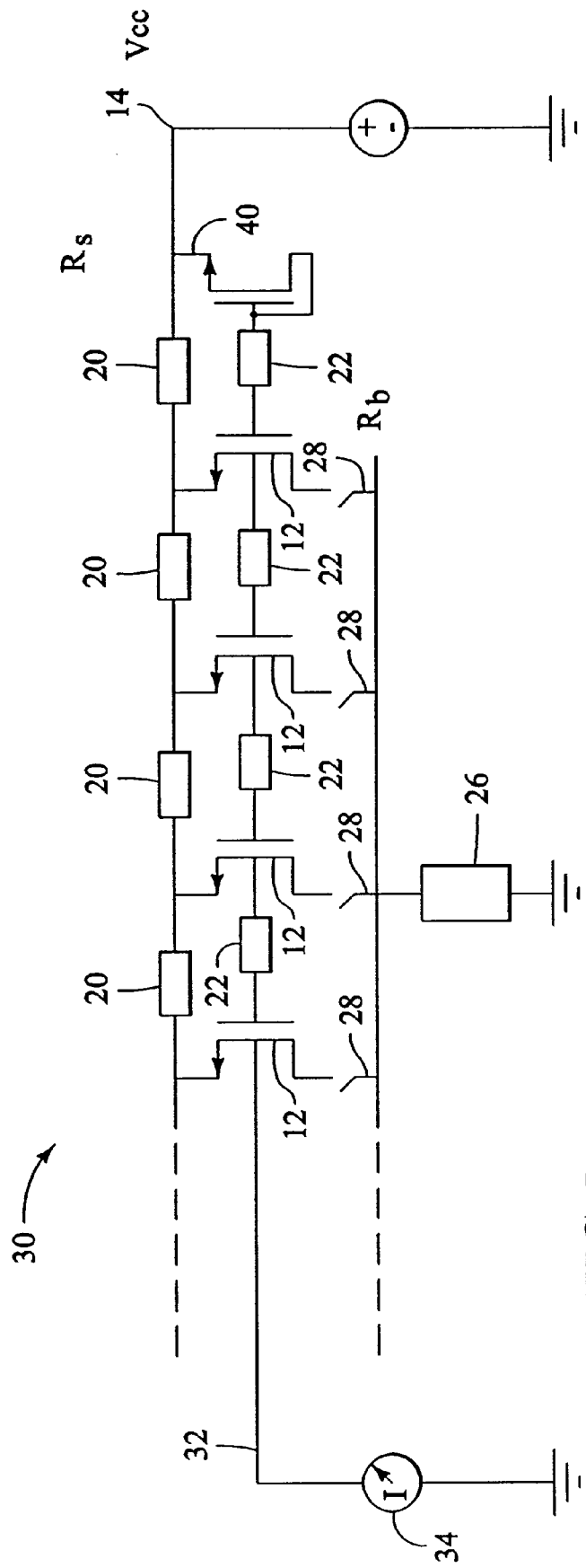
FIG. 5 depicts an embodiment of a digital-to-analog converter with a current source for the gates.

FIG. 5 depicts an embodiment of a DAC 30 in which a current supply 34 and transistor 40 furnish gate current for the transistors in the DAC series. Power supply $V_{CC}$ furnishes power for the transistor drain to source currents. While the prior-art gate supply was a voltage supply, this embodiment uses a current source with a gate supply path 32. A series of small resistors $R_b$ 22 may be used, as previously, to provide a voltage-dividing function for the gate-supply series. Alternatively, the constant drops in the gate traces may furnish sufficient and sufficiently-controlled drops to control the gate voltages, rather than using even MOS-produced resistors. It is these constant drops in the traces that cause a slight drop in the voltage at each gate. Therefore, while the potential at each gate varies with respect to $V_{CC}$, the gate-to-source potential within each transistor is the same as all the other transistors within the series, within MOS manufacturing tolerances. A 6-bit converter uses $2^6$ (64) transistors, while a 15-bit converter will require $2^5$ (32,768) transistors.

In one embodiment, the drops from gate-to-gate in the series matches the drops from source-to-source in each transistor along source busbar or rail 16. Supply voltage $V_{CC}$ 14 is effectively divided into a series of voltages by the resistors $R_S$ 20. In one embodiment, tailoring the thickness of the traces from source-to-source provides the resistance. Thus, while the drop from source to source in the series is constant, each source in the series is at a lower and lower potential with respect to the rail voltage $V_{CC}$. Within MOS manufacturing tolerances, the drop from source to source is the same. If the drops from gate-to-gate are also constant or equal, then each transistor in the series has a constant $V_{GS}$ or an equal $V_{GS}$ and each transistor performs about the same as all the other transistors, and the digital-to-analog converter has substantially identical unit currents from all current sources.

Figure 6:
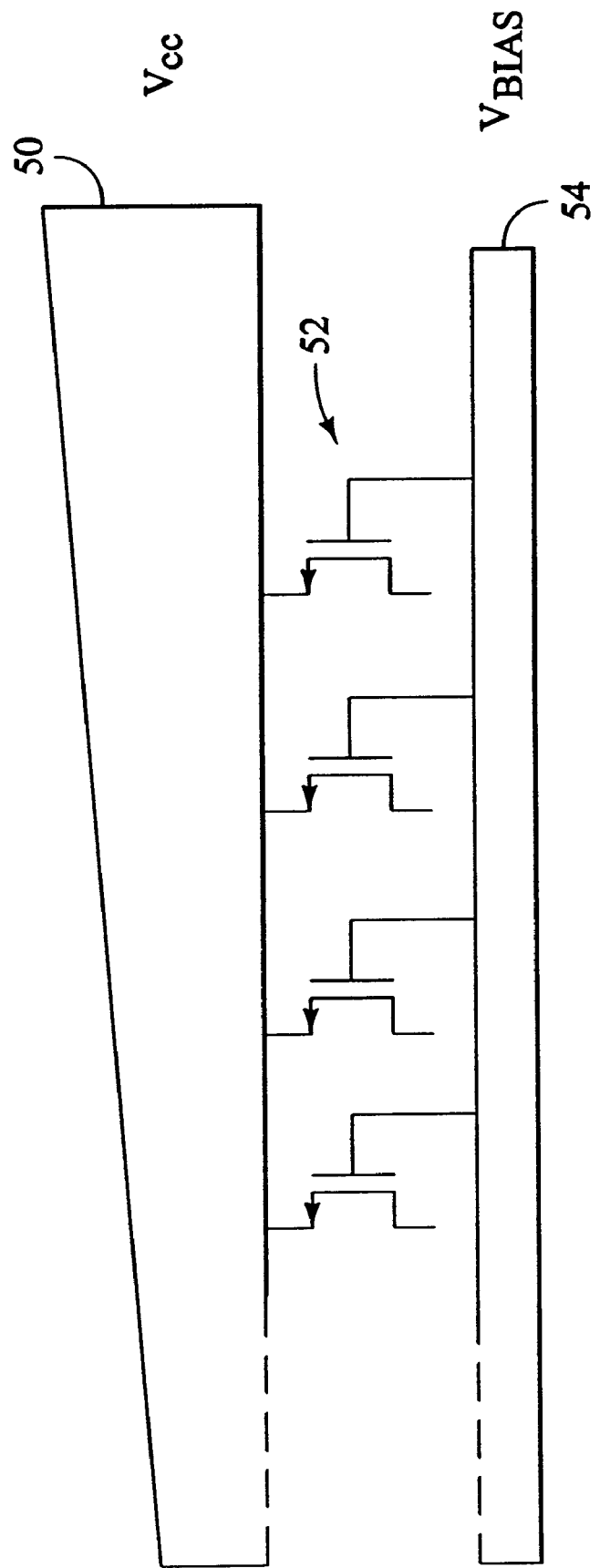
FIG. 6 depicts an embodiment with a constant voltage source for each transistor.

In another embodiment, $V_{GS}$ or $V_{bias}$ is kept equal in each transistor rather than providing a controlled drop in both voltage dividers. The voltages are kept equal or constant by eliminating the constant drops from source-to-source or gate-to-gate by tailoring the voltage rails or busbars. FIG. 6 depicts an embodiment in which busbar 50 connects to the sources of a series of transistors 52, while a second busbar 54 connects to the gates. The gate currents are much lower than the source currents. Thus, the source busbar 50 is tapered, so that there is less resistance on the end of the busbar so connected with supply $V_{CC}$ where the current will be greater, than on the far end of the busbar, away from the power supply, where current will be lower. The taper or increase in resistance matches and makes up for the decrease in current along the line of transistors.

The materials for the busbars may be any conductors suitable for electricity, including but not limited to, copper, aluminum, alloys of copper and alloys of aluminum. Refractory metals or their suicides may also be used, including but not limited to, titanium, tungsten, tantalum and molybdenum. In one embodiment, the traces are plated onto the bus bars by depositing a layer of copper and etching away the portions of the copper not wanted for busbars. The thickness of the conductor may vary from less than 1 to several micrometers. Polysilicon and doped polysilicon may also be used.

Figure 7:
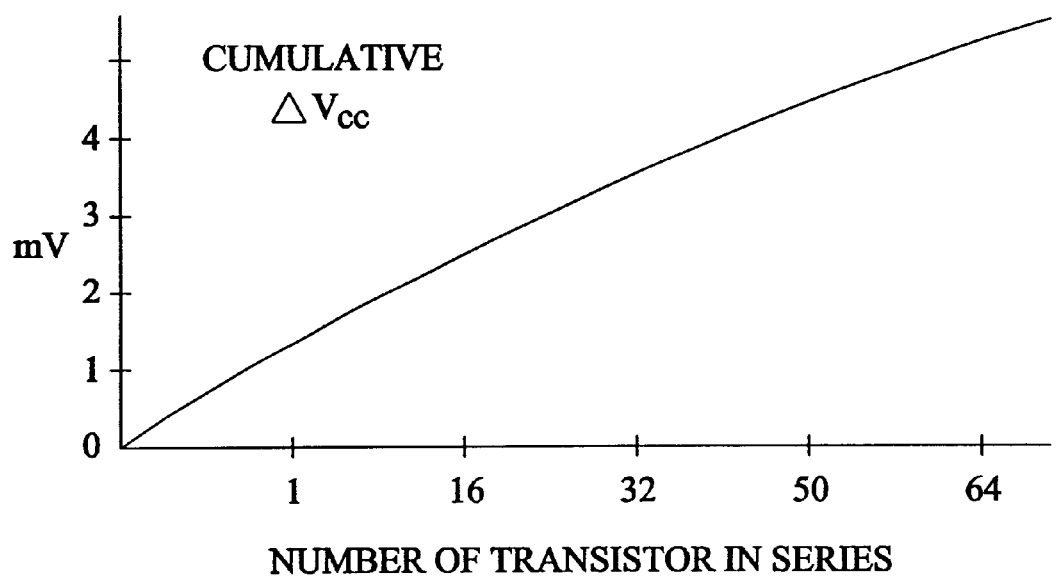
FIG. 7 depicts a performance curve for the present invention.
Figure 8:
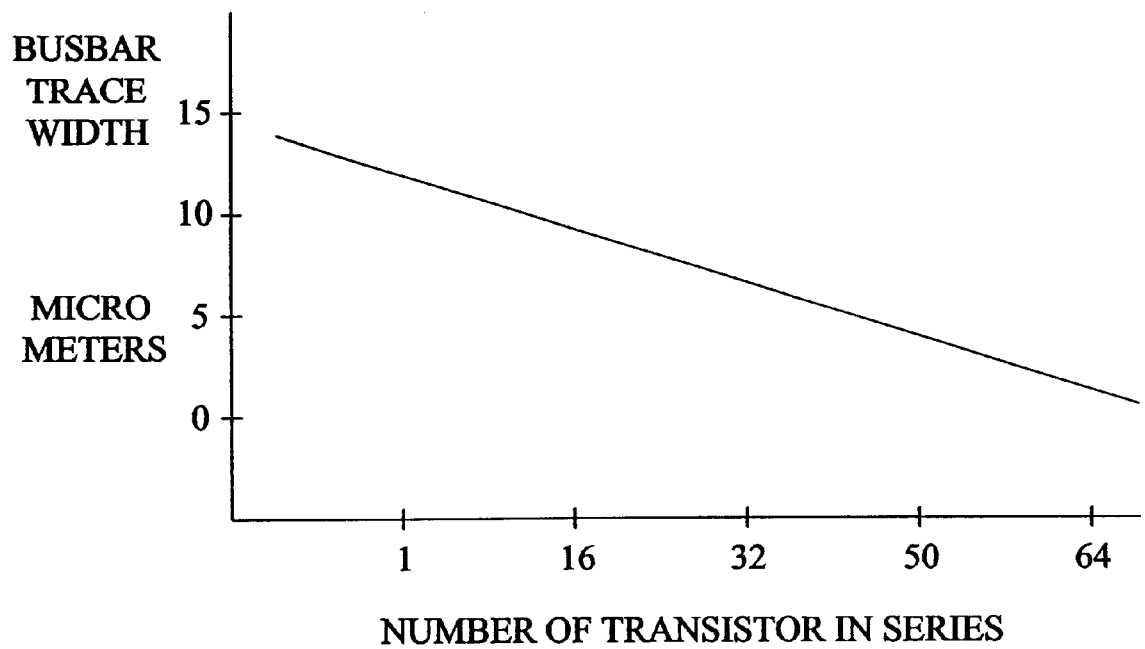
FIG. 8 depicts an exemplary bus trace width.
Figure 9:
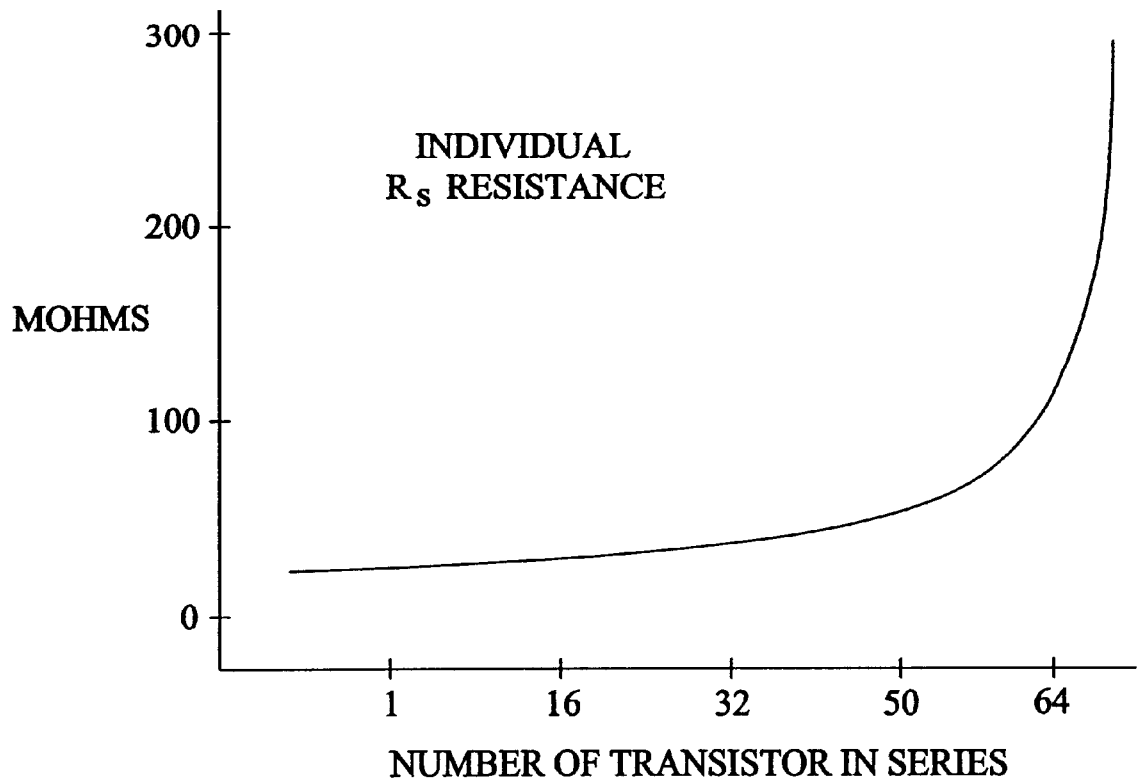
FIG. 9 depicts an exemplary performance curve.

FIG. 7 depicts a cumulative voltage drop from source-to-source of the transistors in the series of FIG. 6. Even with the thicker traces of the tapered busbar, the source voltages show a slowly cumulative drop. FIG. 8 depicts one embodiment of the tapered busbar or trace 50, which may have an initial thickness or width of about 10–15 micrometers, and linearly tapers over the span of 64 MOS transistors to about 0.5–2 micrometers. The effect of this taper on individual, not cumulative, source-to-source resistances, or $R_S$, is depicted in FIG. 9. Resistances begin at a very low level, on the end of the busbar where current is high. But as the source current proceeds to the end transistors, the busbar or trace becomes very thin, and the resistance of the busbar increases almost exponentially toward the very end. To counteract sudden changes in resistance or to decrease resistance of the bar, the width of the busbar is increased. For example, the narrow end of the busbar may be limited to 5–6 micrometers, rather than proceeding to a narrower 0.5 or 1.0 or 2 micrometers. The result of individual transistor voltage drops in a linearly tapering busbar is shown cumulatively in FIG. 7, with a monotonic and almost linear increase even with the greater resistance at the sources of the last transistors.

In one embodiment, the taper in the busbars thus varies linearly where one end of the busbar is about 0.5 micrometers wide and the other end about 15 micrometers wide, for a variance of 1:30 parts over the length of the busbar or the DAC portion. In another embodiment, the narrow end is about 2 micrometers and the wider end is about 13 micrometers, for about a 1:6 variance over the length of the busbar. These ranges also suffice for the gate busbars mentioned below. Other ranges and shapes may be used, as shown in FIG. 11.

Figure 10:
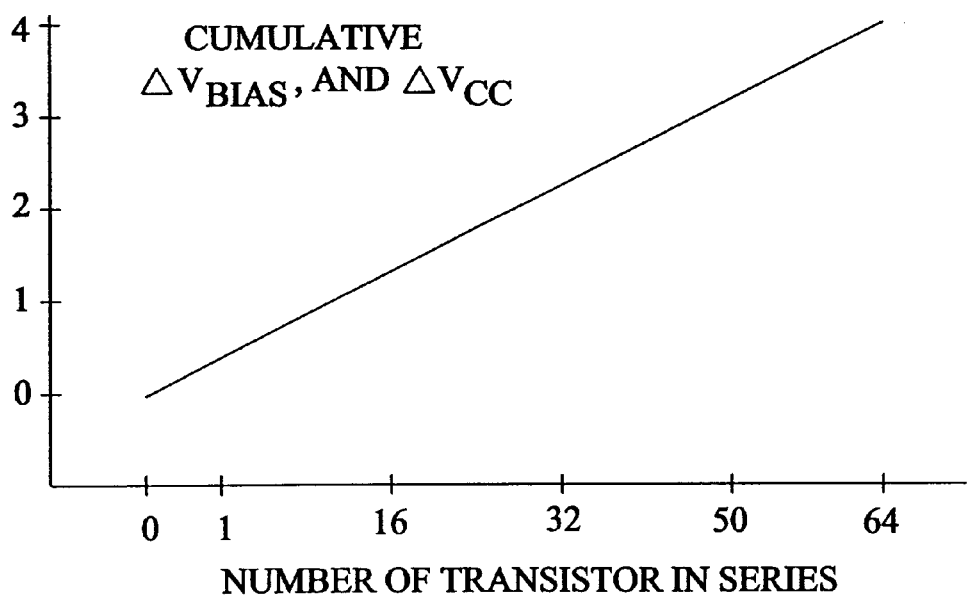
FIG. 10 depicts another performance curve.

FIG. 10 depicts a desired matching result of cumulative source-to-source voltage drops on the same transistors, using a gate current sourcing technique shown in FIG. 5. The voltage drops have not been reduced to zero, but are now matched to the drops in the sources. The result is that the gate-to-gate voltages are similar to the source-to-source voltages, leading to uniform currents in each of the transistors. Uniformity of transistor currents is within 0.1%. Moreover, with this matching of current and voltage values, the transistor performance and thus the DAC performance tends to be uniform over variations in temperature and other environmental conditions.

It is possible to calculate the dimensions of the source traces or tapered busbars by examining the physical layout of the DAC. If each transistor takes the same amount of space, or length $L_0$ on the busbar, then the resistance $R_{SN}$ of the Nth "segment" for a transistor is $R_{square} \cdot L_0/W_N$, where $R_{square}$ is the characteristic resistance of the conductor used for the trace or busbar and $W_N$ is the average width of the Nth segment. $R_{SN}$ may also be computed from the constant drop in each segment, so that $R_{SN} = R_{square} L_0/(I_{bias} \cdot R_b)$ $(I_0 - N \cdot I_N)$, where $I_{bias}$ is the gate current, $R_b$ is the gate resistor value, $I_0$ is the initial source current, and $I_N$ is the unit current of each transistor. Setting both equations equal to $R_{SN}$, assuming an equal length $L_0$ for each segment having a transistor, and also assuming that the drain current for each transistor is equal $(I_N)$, $W_N$, the width of the Nth segment, is equal to $R_{square} \cdot L_0/[(I_b \cdot R_b) \cdot (I_0 - N \cdot I_N)]$. Thus, the width decreases linearly in N steps from its initial width. Other formulae and resulting taper functions may be used depending on the desires of the user. In practice, approximations may also be used, agreeing generally with the shape depicted in FIG. 6.

Figure 11:
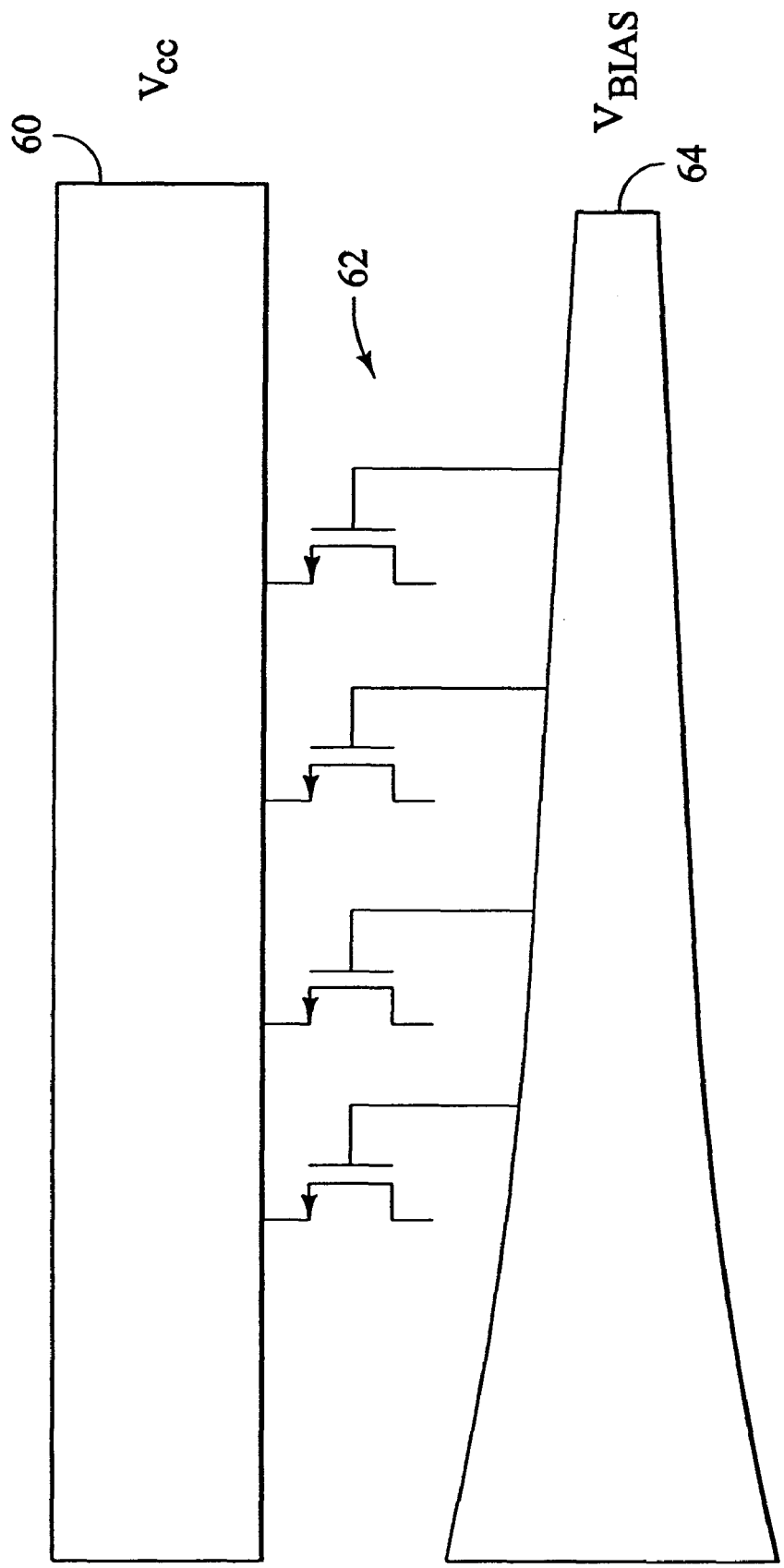
FIG. 11 depicts an alternate embodiment using a reverse taper busbar for the gates.

FIG. 11 depicts another embodiment, with a source busbar or supply rail 60 of constant cross-section while the gate busbar 64 supplying $V_G$ or $V_{bias}$ has a taper in the opposite direction; that is, the power source and the greater current is at the narrow end of the busbar. The shape of width of the $V_{bias}$ busbar or trace is inversely proportional to the current density in the $V_{CC}$ bar. The voltage from source-to-source decreases incrementally from transistor to transistor in the series. The voltage from gate-to-gate also decrease incrementally. Gate currents are very small, especially compared to drain-to-source currents. The incremental decrease in current in the series of FIG. 7, moving from right to left, is matched by incremental decreases in resistance of the gate busbar 64 as it becomes larger and larger, moving also from right to left. The gate-to-source voltage is constant, insuring good performance of the digital-to-analog converter.

It will be recognized that there are many ways to practice the invention. The embodiments have described digital-to-analog converters using only a series of transistors, without weighted resistors or weighted reference voltages, which require far fewer transistors in series. The invention could be practiced in DACs using such techniques as well. Other types DACs employing ladder resistor networks could also benefit from the invention. Accordingly, it is the intention of the applicant to protect all variations and modifications within the valid scope of the present invention. It is intended that the invention be defined by the following claims, including all equivalents.

What is claimed is:

1. A MOS digital-to-analog converter, comprising:
   at least one source voltage supply;
   at least one gate current supply; and
   at least two transistors in series with the gate current supply and the source voltage supply, wherein the source voltage supply further comprises a voltage divider and the gate current supply further comprises a voltage divider, and the cumulative resistance of the voltage dividers is controlled such that the gate-to-source voltages are constant.

2. The converter of claim 1, wherein the transistors comprise a series of 16 to 32768 transistors.

3. The converter of claim 1, wherein the gate current supply is connected to the source voltage supply.

4. The converter of claim 1, further comprising a series of switches corresponding to the series of transistors, and wherein a position of each switch and an output of the converter depends on a digital signal input to the converter.

5. A MOS digital-to-analog converter, comprising:
   a source voltage supply;
   a gate voltage supply;
   at least two transistors in series with the source voltage supply and the gate voltage supply;
   a source bus having a taper from a first end to a second end, the source bus connected at the first end to the source voltage supply and connected to a source of each transistor; and
   a gate bus connected to the gate voltage supply, wherein the gate to source voltage for each transistor is constant and the transistor series does not use precision resistors or capacitors.

6. The converter source of claim 5, wherein the source bus tapers from about 6 parts to 30 parts at the first end to about 1 part at the second end.

7. The converter of claim 5, further comprising a series of switches corresponding to the series of transistors, and wherein a position of each switch and an output of the converter depends on a digital signal input to the converter.

8. The cell row of claim 5, wherein the transistors comprise a series of 16 to 32,768 transistors.

9. A MOS digital-to-analog converter, comprising:
   a source voltage supply;
   a gate voltage supply;
   at least two transistors in series with the source voltage supply and the gate voltage supply;
   a gate bus having a taper from a second end to a first end, the gate bus connected at the first end to the gate voltage supply and connected to a gate of each transistor; and a source bus connected to the source voltage supply, wherein the gate to source voltage for each transistor is constant.

10. The converter of claim 9, wherein the gate bus has a taper of from about 6 part to about 30 parts at the first end to about 1 part at the second end.

11. The converter of claim 9, further comprising a series of switches corresponding to the series of transistors, and wherein a position of each switch and an output of the converter depends on a digital signal input to the converter.

12. A method of converting a digital signal to an analog signal comprising:

providing a digital signal:

setting a series of switches, a position of each switch depending on the digital signal;

providing a series of MOS transistors corresponding to the series of switches, each transistor having a constant gate-to-source voltage, wherein the series of MOS transistors further comprises a source voltage supply and a gate current supply, wherein the source voltage supply further comprises a voltage divider and the gate current supply further comprises a voltage divider, and the cumulative resistance of the voltage dividers is controlled such that the gate-to-source voltages are constant;

generating a voltage in a load resistor due to the current flowing from the transistors through the switches; and providing an analog signal.

13. The method of claim 12, further comprising providing a constant gate-to gate voltage for each transistor.

\* \* \* \* \*

UNITED STATES PATENT AND TRADEMARK OFFICE
CERTIFICATE OF CORRECTION

PATENT NO.      : 6,498,574 B2
DATED           : December 24, 2002
INVENTOR(S)     : Thomas Blon It is certified that error appears in the above-identified patent and that said Letters Patent is hereby corrected as shown below:

<u>Title page,</u>
Item [56], References Cited, OTHER PUBLICATIONS, reference "Technologies..." delete "html,  1 page," and substitute -- html, 1 page, -- in its place.

<u>Column 8,</u>
Line 15, delete "gate-to gate" and substitute -- gate-to-gate -- in its place.

Signed and Sealed this

First Day of July, 2003

JAMES E. ROGAN
*Director of the United States Patent and Trademark Office*